US 8,466,558 B2

(12) United States Patent
Yoo

(10) Patent No.: US 8,466,558 B2
(45) Date of Patent: Jun. 18, 2013

(54) SEMICONDUCTOR PACKAGE AND SEMICONDUCTOR SYSTEM INCLUDING THE SAME

(75) Inventor: Jae-Wook Yoo, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/234,175

(22) Filed: Sep. 16, 2011

(65) Prior Publication Data

US 2012/0119370 A1 May 17, 2012

(30) Foreign Application Priority Data

Nov. 11, 2010 (KR) .................. 10-2010-0112273

(51) Int. Cl.
*H01L 29/40* (2006.01)
(52) U.S. Cl.
USPC 257/773; 257/E23.023; 257/99; 257/E33.056; 257/E33.075; 438/26; 438/27; 438/28; 438/29
(58) Field of Classification Search
USPC .............. 257/773, E23.023, 99, E33.056, 257/E33.075; 438/26–29
See application file for complete search history.

(56) References Cited

U.S. PATENT DOCUMENTS

| 6,117,759 | A  | * | 9/2000 | Greer et al. | 438/616 |
| 6,274,473 | B1 | * | 8/2001 | Blish et al. | 438/612 |
| 7,268,014 | B2 | * | 9/2007 | Lee et al. | 438/106 |
| 2002/0039847 | A1 | * | 4/2002 | Clayton | 439/65 |
| 2002/0121707 | A1 | * | 9/2002 | Pendse et al. | 257/778 |
| 2003/0168728 | A1 | * | 9/2003 | Hiruma | 257/700 |
| 2005/0067935 | A1 | * | 3/2005 | Lee et al. | 313/309 |
| 2006/0056213 | A1 | * | 3/2006 | Lee et al. | 363/144 |
| 2006/0071598 | A1 | * | 4/2006 | Eden et al. | 313/631 |
| 2007/0080360 | A1 | * | 4/2007 | Mirsky et al. | 257/99 |
| 2008/0036096 | A1 | * | 2/2008 | Karnezos | 257/778 |
| 2008/0185718 | A1 | * | 8/2008 | Suh et al. | 257/737 |
| 2009/0166664 | A1 | * | 7/2009 | Park et al. | 257/99 |
| 2009/0261356 | A1 | * | 10/2009 | Lee et al. | 257/88 |
| 2009/0266599 | A1 | * | 10/2009 | Kan et al. | 174/263 |
| 2010/0078329 | A1 | * | 4/2010 | Mirsky et al. | 205/82 |
| 2010/0087035 | A1 | * | 4/2010 | Yoo et al. | 438/109 |
| 2010/0176498 | A1 | * | 7/2010 | Lee et al. | 257/675 |
| 2010/0255274 | A1 | * | 10/2010 | Mirsky et al. | 428/209 |
| 2010/0289131 | A1 | * | 11/2010 | Bathan et al. | 257/686 |
| 2011/0049710 | A1 | * | 3/2011 | Kao et al. | 257/738 |
| 2011/0095419 | A1 | * | 4/2011 | Horiuchi et al. | 257/737 |
| 2011/0101392 | A1 | * | 5/2011 | Park et al. | 257/98 |
| 2011/0101406 | A1 | * | 5/2011 | Heo et al. | 257/99 |
| 2011/0140268 | A1 | * | 6/2011 | Cheah et al. | 257/737 |
| 2011/0147916 | A1 | * | 6/2011 | Su | 257/692 |
| 2011/0199787 | A1 | * | 8/2011 | Kim et al. | 362/612 |
| 2011/0220404 | A1 | * | 9/2011 | Yamasaki et al. | 174/261 |

(Continued)

FOREIGN PATENT DOCUMENTS

JP 2009-123863 6/2009

*Primary Examiner* — N Drew Richards
*Assistant Examiner* — Ankush Singal
(74) *Attorney, Agent, or Firm* — F. Chau & Associates, LLC

(57) ABSTRACT

Provided are a semiconductor package and a semiconductor system including the semiconductor package. The semiconductor package includes a semiconductor device and an interconnect structure electrically connected to the semiconductor device and delivering a signal from the semiconductor device, wherein the interconnect structure includes an anodized insulation region and an interconnect adjacent to and defined by the anodized insulation region.

20 Claims, 13 Drawing Sheets

U.S. PATENT DOCUMENTS

2011/0284382 A1* 11/2011 Park et al. ....................... 205/50
2011/0316035 A1* 12/2011 Shin et al. ....................... 257/99
2011/0317387 A1* 12/2011 Pan et al. ....................... 361/782
2012/0043669 A1* 2/2012 Refai-Ahmed et al. ...... 257/777

* cited by examiner

"Fig. 11"

SEMICONDUCTOR PACKAGE AND SEMICONDUCTOR SYSTEM INCLUDING THE SAME

CROSS-REFERENCE TO RELATED APPLICATION

This application claims priority from Korean Patent Application No. 10-2010-0112273 filed on Nov. 11, 2010 in the Korean Intellectual Property Office, and all the benefits accruing therefrom under 35 U.S.C. 119, the contents of which in its entirety are herein incorporated by reference.

BACKGROUND

1. Technical Field

The present inventive concept relates to a semiconductor package and a semiconductor system including the semiconductor package.

2. Discussion of the Related Art

With rapid development of the electronics industry, there are increasing demands for smaller, lighter, and more functional electronic products. In response to such trends, technologies for integrating homogenous or heterogeneous semiconductor devices into a single semiconductor package have been developed.

Increasing demands for high functional/high-speed devices require, in some cases, more than about 1,000 package pins. Due to limitations in the size of the semiconductor packages, a pitch between package pins (e.g., solder balls) is significantly decreased to accommodate the larger number of package pins. However, it is necessary to provide an appropriate pitch so as to prevent shorts between adjacent package pins.

As a thickness of a set on which a semiconductor package is mounted decreases, a thickness of a semiconductor package must also decrease.

Decreasing the thickness of a semiconductor substrate is a commonly used method to reduce the thickness of the semiconductor package. However, this may cause warping of a semiconductor package.

SUMMARY

Embodiment of the present inventive concept provide a semiconductor package including an anodized interconnect structure, and a semiconductor system including the semiconductor package.

These and other objects of the present inventive concept will be described in or be apparent from the following description of exemplary embodiments.

According to an aspect of the present inventive concept, there is provided a semiconductor package including a first semiconductor device and a first interconnect structure electrically connected to the first semiconductor device and delivering a signal from the first semiconductor device, wherein the first interconnect structure includes a first anodized insulation region and a first interconnect adjacent to and defined by the first anodized insulation region.

According to another aspect of the present inventive concept, there is provided a semiconductor package including a first semiconductor device including a plurality of first external terminals having a first pitch, a second semiconductor device including a plurality of second external terminals having a second pitch that is different from the first pitch, and an interposer that is disposed between the first and second semiconductor devices and that electrically connects the first external terminals with the second external terminals, wherein the interposer includes an anodized insulation region and an interconnect adjacent to defined by the anodized insulation region.

According to an aspect of the present inventive concept, there is provided a semiconductor system including a module substrate, and a semiconductor package disposed on the module substrate.

According to an aspect of the present inventive concept, a semiconductor package comprises a semiconductor device, and an interconnect structure electrically connected to the semiconductor device, wherein the interconnect structure includes a plurality of anodized insulation regions and a plurality of interconnects respectively positioned between adjacent anodized insulation regions.

Ends of the interconnects may protrude beyond at least one of top and bottom surfaces of the anodized insulation regions. The interconnects may be formed in substantially an L-shape. Top parts of the L-shaped interconnects may be exposed at a first surface of the interconnect structure, and bottom parts of the L-shaped interconnects having a larger width than the top parts may be exposed at a second surface of the interconnect structure, the second surface being positioned opposite the first surface.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION

Figure 1:
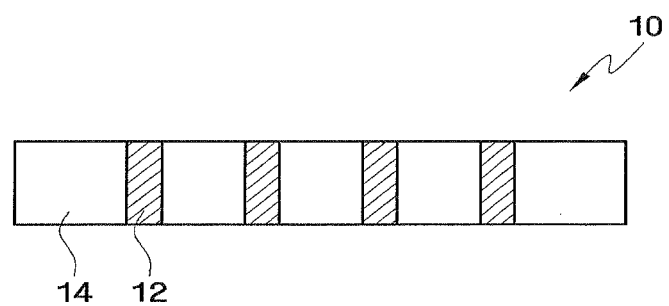
FIG. 1 is a cross-sectional view showing an example of an interconnect structure for use in a semiconductor package according to embodiments of the present inventive concept.

Embodiments of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Like reference numerals may refer to the same or similar elements throughout the specification.

It will be understood that when an element is referred to as being "connected to" or "coupled to" another element, it can be directly connected or coupled to the other element or intervening elements may be present. As used herein, the term "and/or" includes any and all combinations of one or more of the associated listed items.

Hereinafter, semiconductor packages according to embodiments of the present inventive concept will be described with reference to the accompanying drawings.

FIG. 1 is a cross-sectional view showing an example of an interconnect structure 10 for use in a semiconductor package according to embodiments of the present inventive concept.

Referring to FIG. 1, the interconnect structure 10 includes anodized insulation regions 14 and interconnects 12 defined by the anodized insulation regions 14. The interconnects 12 penetrate the interconnect structure 10.

According to an embodiment, the interconnects 12 are made of, for example, a metal such as aluminum (Al). According to an embodiment, the anodized insulation regions 14 are made of, for example, metal oxide such as aluminum oxide.

Using an anodizing process, a portion of a metal thin film is converted to metal oxide to form the anodized insulation regions 14. A portion of the metal thin film that is not subjected to the anodizing process (the portion blocked during the anodizing process) becomes the interconnects 12.

By using an anodizing process, a fine pitch interconnect structure can be provided. Using the anodizing process also reduces the manufacturing time and manufacturing costs when compared to use of a through electrode such as Through Silicon Via (TSV). In general, a method of manufacturing through electrodes includes forming holes by drilling or laser processing and filling the holes with conductive materials. The forming of the holes requires more time and cost than that associated with the anodizing process. In addition, it is more difficult to achieve a fine pitch when forming the holes. According to the present embodiment, an anodizing process is simpler and has lower manufacturing costs than a drilling or laser process.

Furthermore, use of the interconnect structure instead of solder balls may reduce warping of a package substrate, which will be described in more detail with reference to FIGS. 11 and 14.

Figure 2:
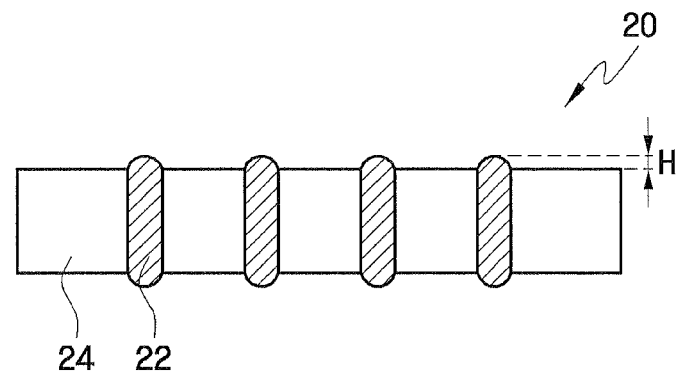
FIG. 2 is a cross-sectional view showing another example of an interconnect structure for use in a semiconductor package according to embodiments of the present inventive concept.

FIG. 2 is a cross-sectional view showing another example of an interconnect structure 20 for use in a semiconductor package according to embodiments of the present inventive concept.

Referring to FIG. 2, the interconnects 22 of the interconnect structure 20 are thicker than the anodized insulation regions 24. According to an embodiment, the interconnects 22 protrude upward above and/or downward below the anodized insulation regions 24 by a predetermined height H in order to facilitate coupling of the interconnects 22 with other semiconductor devices, which is described in more detail with reference to FIG. 8.

After forming the anodized insulation regions 24 using the anodizing process, etching is performed to remove a portion of a surface of the anodized insulation regions 24. That is, etching is performed to cause the interconnects 22 to protrude higher than the anodized insulation regions 24.

Figure 3:
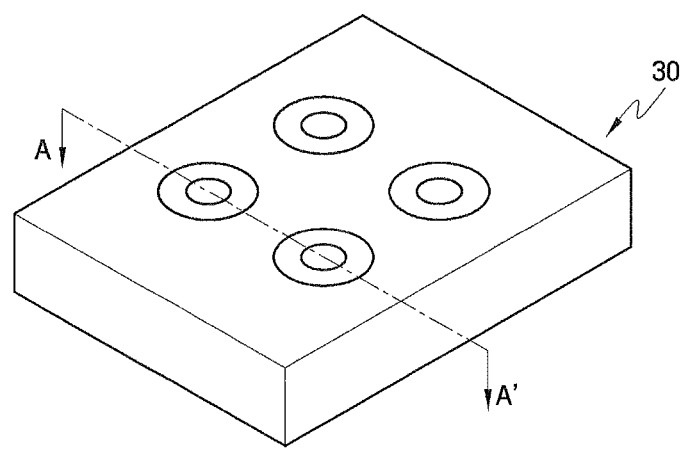
FIG. 3 is a perspective view showing another example of an interconnect structure for use in a semiconductor package according to embodiments of the present inventive concept.
Figure 4:
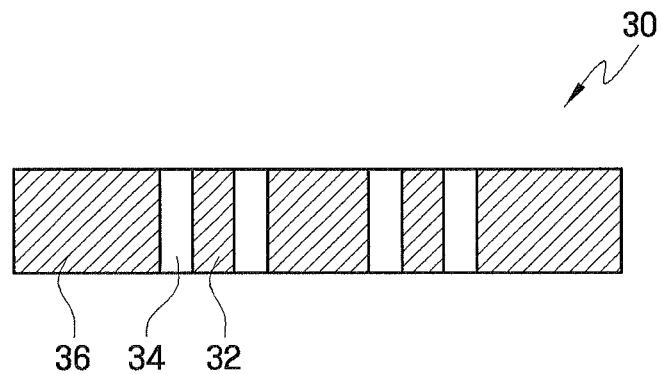
FIG. 4 is a cross-sectional view taken along line A-A' of FIG. 3.

FIG. 3 is a perspective view showing another example of an interconnect structure 30 for use in a semiconductor package according to embodiments of the present inventive concept. FIG. 4 is a cross-sectional view taken along line A-A' of FIG. 3.

Referring to FIGS. 3 and 4, the interconnect structure 30 includes interconnects 32, anodized insulation regions 34, and peripheral regions 36 having conductivity characteristics.

The anodized insulation regions 34 electrically isolate the peripheral regions 36 from the interconnects 32. According to an embodiment, the peripheral regions 36 are grounded. Since signals are transmitted through the interconnects 32, signal transmission characteristics may be improved when the peripheral regions 36 surrounding the interconnects 32 are grounded.

Figure 5:
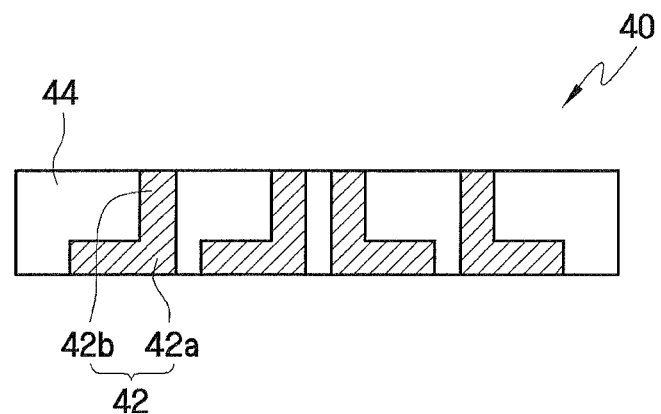
FIG. 5 is a cross-sectional view showing another example of an interconnect structure for use in a semiconductor package according to embodiments of the present inventive concept.
Figure 6:
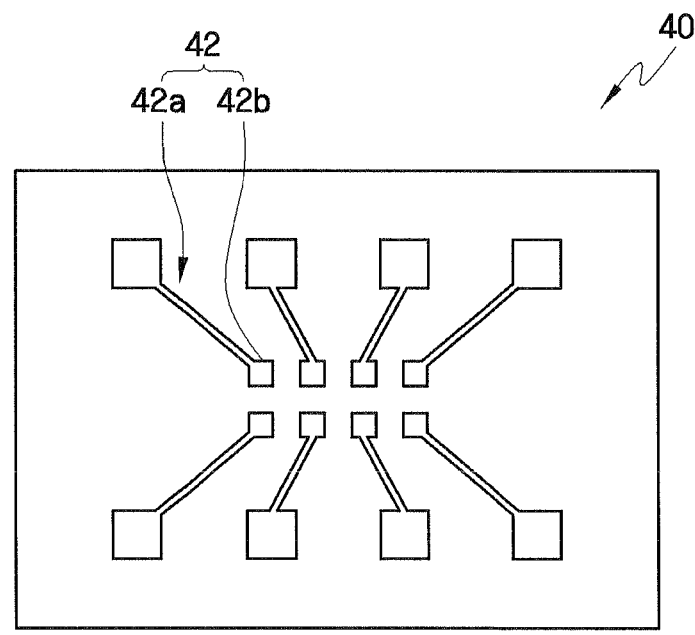
FIG. 6 is a plan view of the interconnect structure of FIG. 5.

FIG. 5 is a cross-sectional view showing another example of an interconnect structure 40 for use in a semiconductor package according to embodiments of the present inventive concept. FIG. 6 is a plan view of the interconnect structure 40 of FIG. 5.

Referring to FIGS. 5 and 6, the interconnect structure 40 has one surface (e.g., a top surface) and another surface (e.g., a bottom surface). An interconnect 42 includes a first region 42b exposed to the one surface and a second region 42a exposed to the other surface. According to an embodiment, a width (or area) of the first region 42b may be different from a width (or area) of the second region 42a. As shown in FIGS. 5 and 6, the first region 42b is narrower than the second region 42b. FIG. 6 is a plan view of the interconnect structure 40 when viewed from the other surface (e.g., the bottom surface).

Figure 7:
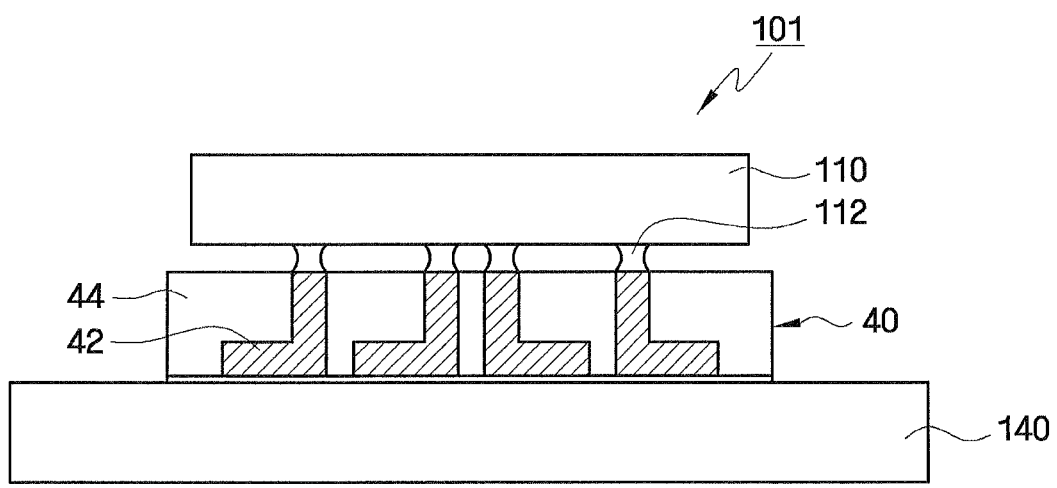
FIG. 7 is a cross-sectional view of a semiconductor package according to an embodiment of the present inventive concept.

FIG. 7 is a cross-sectional view of a semiconductor package 101 according to an embodiment of the present inventive concept.

Referring to FIG. 7, the semiconductor package 101 according to the present embodiment includes a semiconductor device 110, an interconnect structure 40, and a package substrate 140. The interconnect structure 40 is disposed between the semiconductor device 110 and the package substrate 140, and functions as an interposer (electrical interface) between the semiconductor device 110 and the package substrate 140.

According to an embodiment, the semiconductor device 110 may be a logic chip or memory chip, but it is not limited thereto. For example, the semiconductor device 110 may be available in chip form, in wafers, and in packages. Although FIG. 6 shows the semiconductor device 110 having a chip form, it is not limited thereto.

According to an embodiment, the package substrate 140 is a printed circuit board (PCB), but is not limited thereto.

According to an embodiment, the interconnect structure 40 serving as an interposer is connected to the semiconductor device 110 through bumps 112, but is not limited thereto.

For example, the semiconductor device 110 may be connected to the interconnect structure 40 using a solder paste (150 in FIG. 8) instead of the bumps 112. The interconnect structure 40 may also be connected to the package substrate 140 through bumps, a solder paste, or other various materials.

Although not shown in FIG. 7, the semiconductor package 101 may further include a molding layer for molding the semiconductor device 110 on the package substrate 140 and external terminals such as solder balls attached to a bottom of the package substrate 140.

Figure 8:
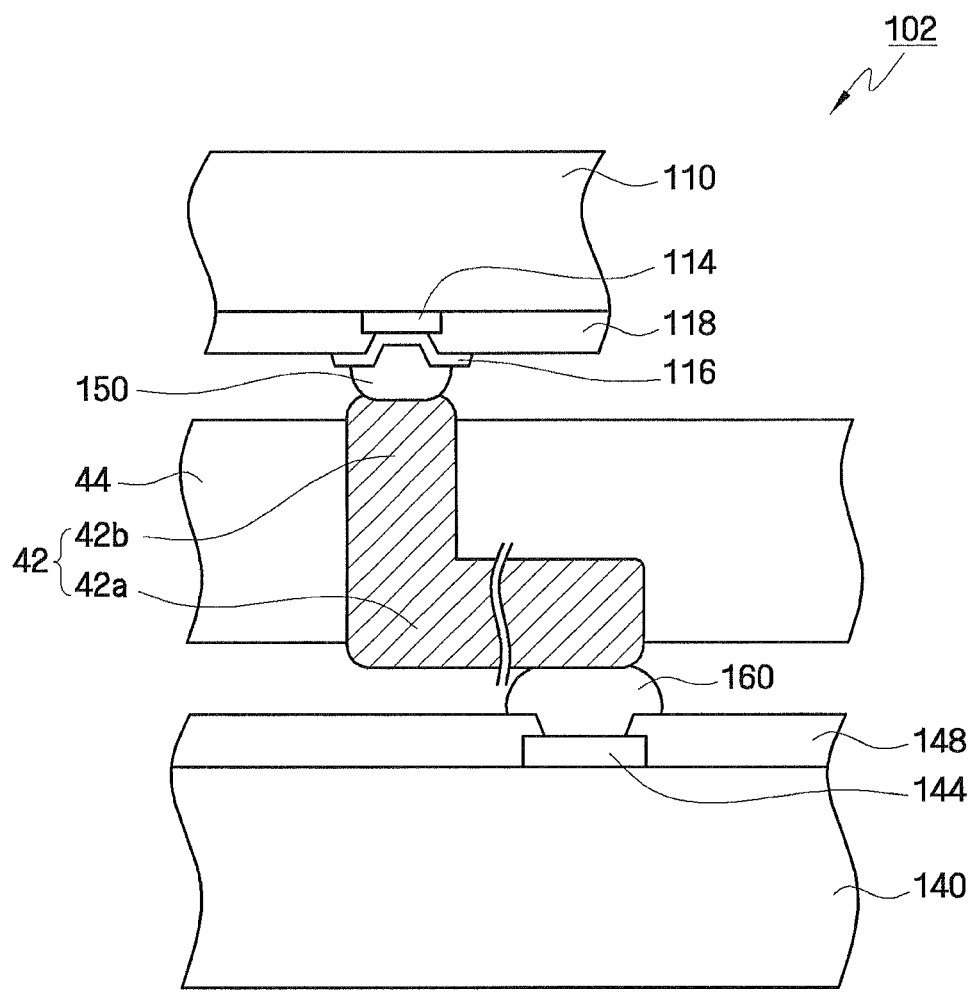
FIG. 8 is a cross-sectional view of a semiconductor package according to another embodiment of the present inventive concept.

FIG. 8 is a cross-sectional view of a semiconductor package according to another embodiment of the present inventive concept. Referring to FIG. 8, a semiconductor device 110 connects to an interconnect structure 40 through a solder paste 150 and the interconnect structure 40 connects to a package substrate 140 through a solder paste 160.

Referring to FIG. 8, a chip pad 114 is mounted on a surface of the chip-form semiconductor device 110, and a protective layer 118 is also formed on the surface of the chip-form semiconductor device 110, and includes an open portion exposing at least a portion of the chip pad 114. An under barrier metal (UBM) 116 is formed on a portion of the protective layer 118 and in the open portion of the protective layer on the exposed portion of the chip pad 114. The solder paste 150 is interposed between the UBM 116 and a first region 42b of an interconnect 42.

A package pad 144 is disposed on a surface of the package substrate 140, and a protective layer 148 is formed on the surface of the package substrate, and includes an open portion exposing at least a portion of the package pad 144. The solder paste 160 is disposed between the exposed portion of the package pad 144 and a second region 42a of the interconnect 42 in the interconnect structure 40.

Figure 9:
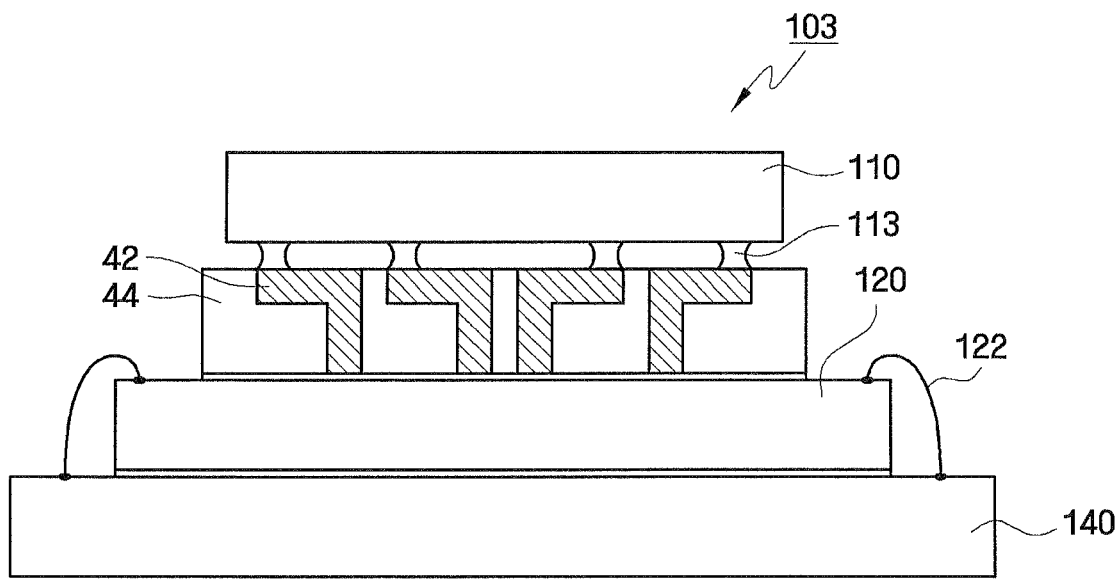
FIG. 9 is a cross-sectional view of a semiconductor package according to another embodiment of the present inventive concept.

FIG. 9 is a cross-sectional view of a semiconductor package 103 according to another embodiment of the present inventive concept. The semiconductor package 103 according to the present embodiment is formed using a Chip-On-Chip (COC) packaging technology, but is not limited thereto.

Referring to FIG. 9, in the semiconductor package 103, an interconnect structure 40 is disposed between first and second semiconductor devices 110 and 120 and serves as an interposer between first and second semiconductor devices 110 and 120.

According to an embodiment, the first and second semiconductor devices 110 and 120 have long and short pitches, and the interconnect structure 40 as an interposer is used to electrically connect the first semiconductor device 110 with the second semiconductor device 120.

As described above, the first and second semiconductor devices 110 and 120 may be logic chips or memory chips. According to an embodiment, the first semiconductor device 110 is a logic chip and the second semiconductor device 120 is a memory chip. The first and second memory devices 110 and 120 may be in the form of chips, wafers, or packages. While FIG. 9 shows the first and second semiconductor devices 110 and 120 having a chip form, they are not limited thereto.

Figure 10:
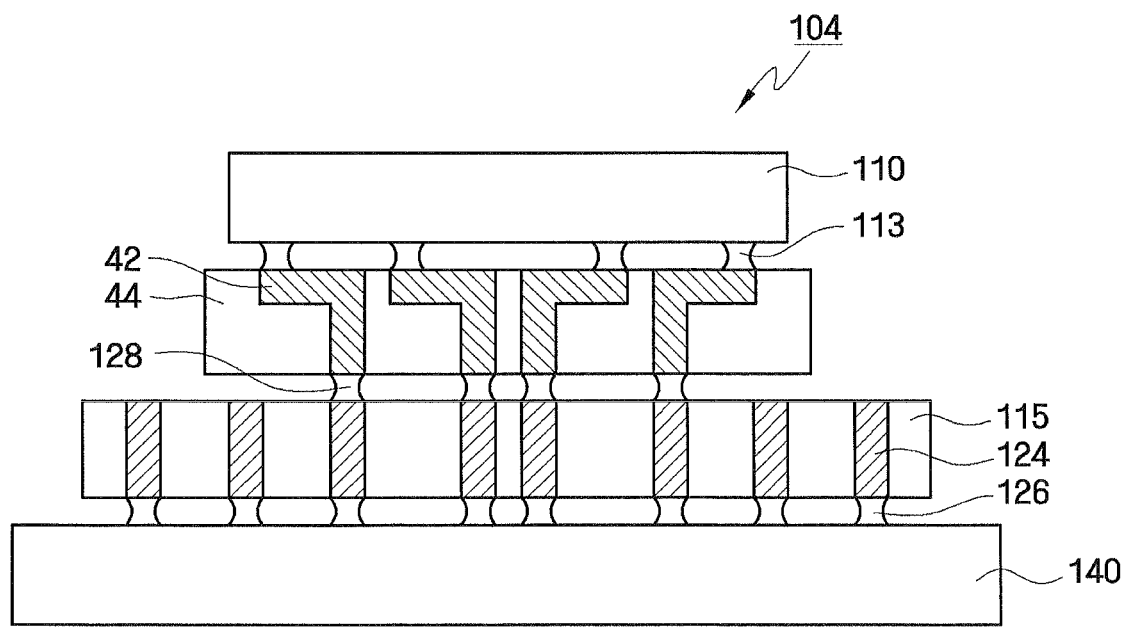
FIG. 10 is a cross-sectional view of a semiconductor package according to another embodiment of the present inventive concept.

The first semiconductor device 110 is electrically connected to the package substrate 140 by wire bonding 122, and the second semiconductor device 120 is electrically connected to the interconnect structure 40 via bumps 113. FIG. 10 is a cross-sectional view of a semiconductor package 104 according to another embodiment of the present inventive concept. Referring to FIG. 10, unlike in the semiconductor package 103 of FIG. 9, a first semiconductor device 115 is connected to a package substrate 140 using through electrodes 124, 124a instead of wire bonding. For example, through electrodes 124 and 124a may be TSVs.

A second semiconductor device 120 exchanges signals with the outside through interconnects 42 of an interconnect structure 40, bumps 126 and 128, the through electrodes 124a, and the package substrate 140. The first semiconductor device 115 exchanges signals with the outside through the through holes 124, the bumps 126, and the package substrate 140.

Figure 11:
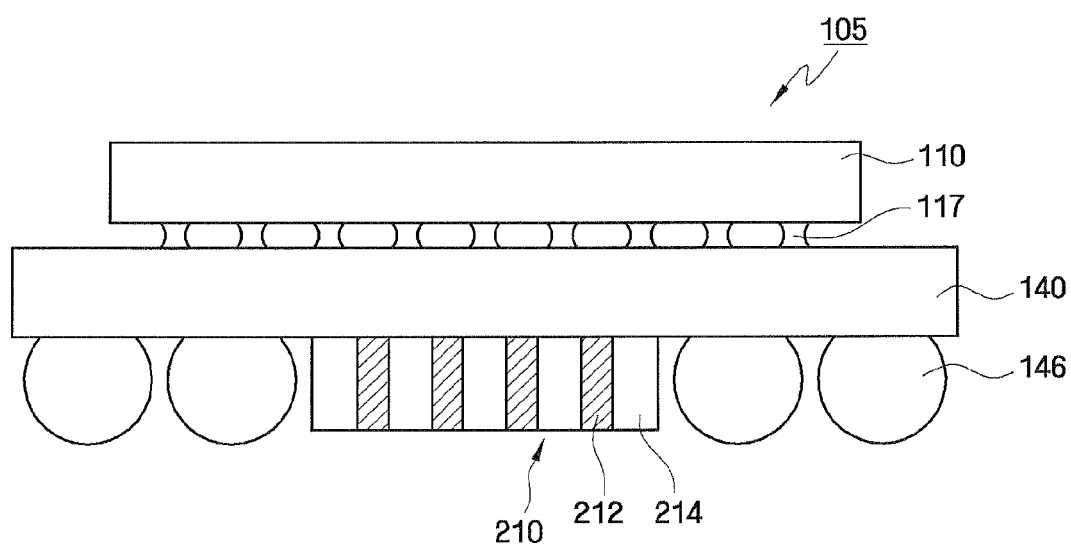
FIG. 11 is a cross-sectional view of a semiconductor package according to another embodiment of the present inventive concept.

FIG. 11 is a cross-sectional view of a semiconductor package 105 according to another embodiment of the present inventive concept. Referring to FIG. 11, in the semiconductor package 105 according to the present embodiment, a semiconductor device 110 is mounted on one surface of the package substrate 140, while an interconnect structure 210 is disposed on another surface of the package substrate 140. External terminals 146 such as, for example, solder balls are bonded to a portion of the other surface of the package substrate 140. The semiconductor device 110 is electrically connected to the package substrate through bumps 117.

The interconnect structure 210 acts as an external terminal of the semiconductor package 105, like solder balls. The interconnect structure 210 includes anodized insulation regions 214 and interconnects 212 defined by the anodized insulation regions 214.

As a set on which a semiconductor package is mounted decreases in thickness, a semiconductor package needs to also have a reduced thickness. Decreasing the thickness of a semiconductor substrate is a commonly used method to reduce the thickness of a semiconductor package. However, this method may cause warping at a middle portion of the package substrate 140.

Thus, since the interconnect structure 210 suffers less deformation than the solder balls, warping of the package substrate 140 can be prevented by disposing the interconnect structure 210 on the middle portion of the package substrate 140.

Figure 12:
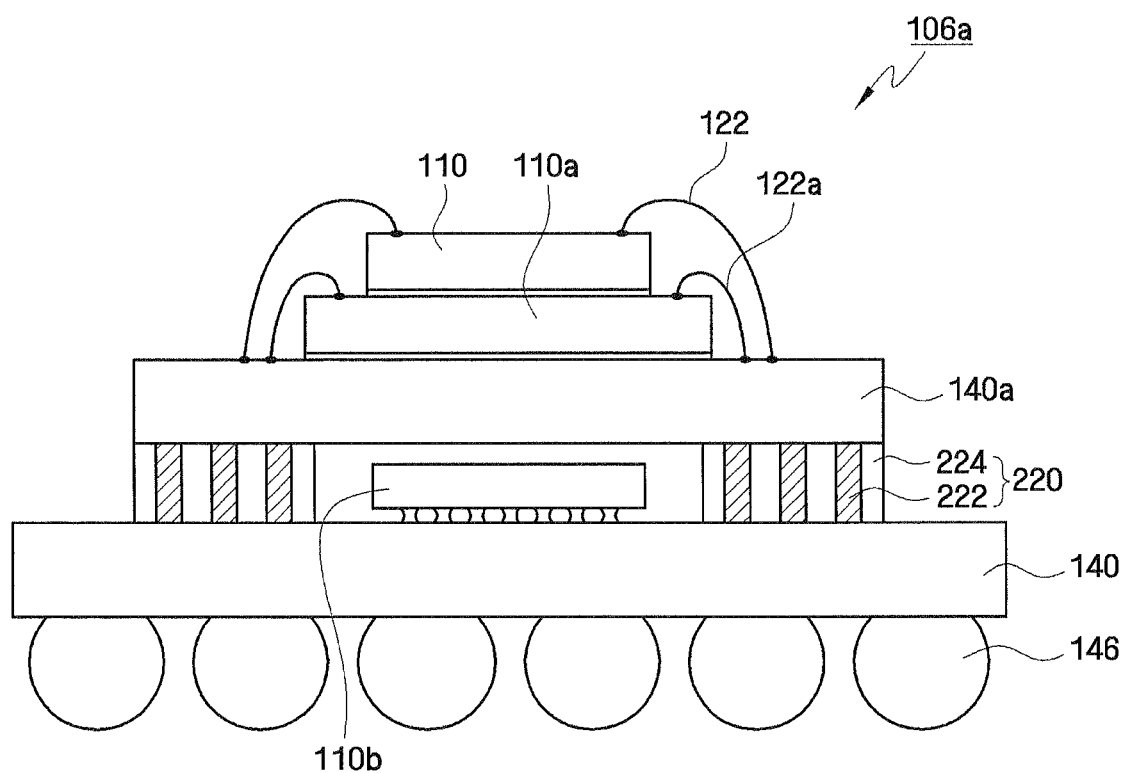
FIG. 12 is a cross-sectional view of a semiconductor package according to another embodiment of the present inventive concept.

FIG. 12 is a cross-sectional view of a semiconductor package 106a according to another embodiment of the present inventive concept. The semiconductor package 106a according to the present embodiment is formed using a Package-On-Package (POP) packaging technique, but is not limited thereto.

In the semiconductor package 106a according to the present embodiment, an interconnect structure 220 is disposed between a first semiconductor package 144 and a package substrate 140 so as to create a space between the first semiconductor package 144 and the package substrate 140 in which a second semiconductor package 110b is mounted.

The first semiconductor package 144 includes chip-form semiconductor devices 110 and 110a sequentially stacked on a package substrate 140a. According to an embodiment, the chip-form semiconductor devices 110 and 110a are connected to a package substrate 140a by wire bonding 122, 122a, but are not limited thereto.

The interconnect structure 220 may serve as an interconnect in a POP semiconductor package as well. According to an embodiment, the first semiconductor package 144 exchanges signals with the outside through the interconnect structure 220 and the package substrate 140.

Figure 13:
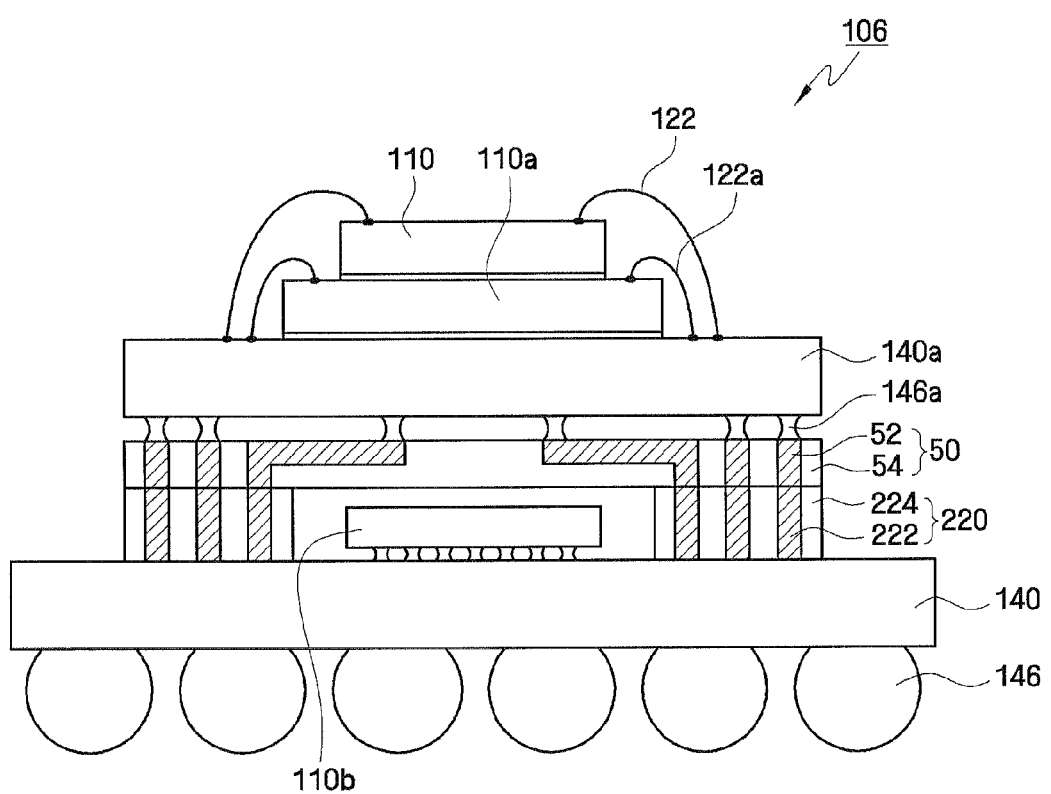
FIG. 13 is a cross-sectional view of a semiconductor package according to another embodiment of the present inventive concept.

FIG. 13 is a cross-sectional view of a semiconductor package 106 according to another embodiment of the present inventive concept.

Referring to FIG. 13, in the semiconductor package 106 according to the present embodiment, an interconnect structure 50 is disposed between a first semiconductor package 144 and an interconnect structure 220. A space is created between the package substrates 140 and 140a, by the interconnect structures 50 and 220, and a second semiconductor package 110b is disposed within the space.

Figure 14:
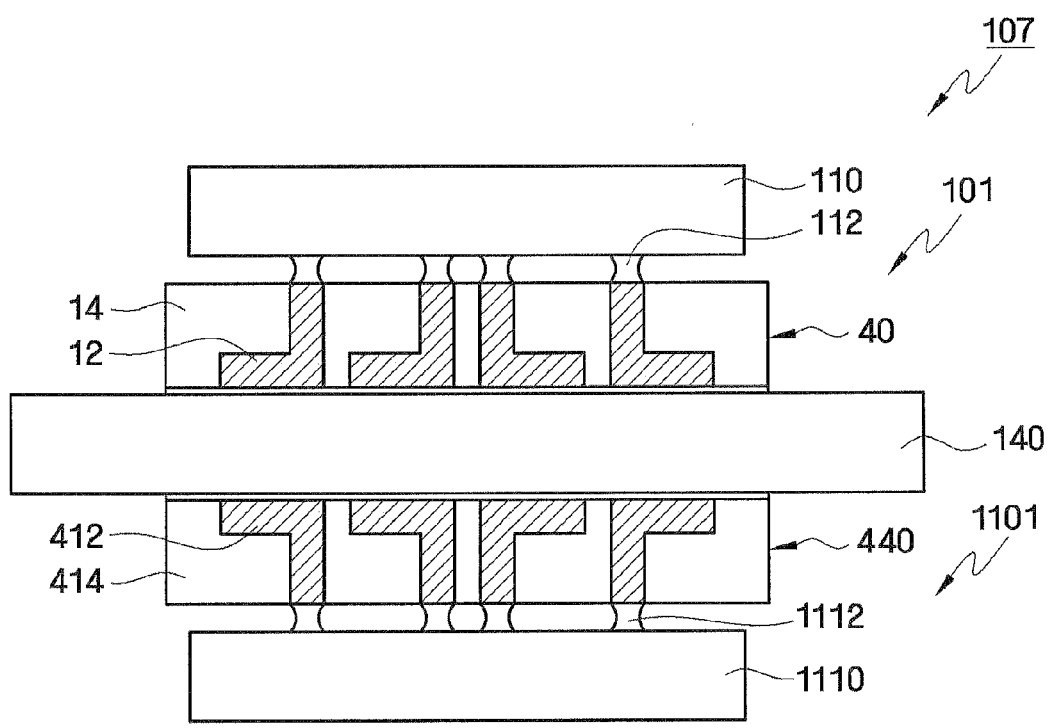
FIG. 14 is a cross-sectional view of a semiconductor package according to another embodiment of the present inventive concept.

FIG. 14 is a cross-sectional view of a semiconductor package 107 according to another embodiment of the present inventive concept. Referring to FIG. 14, the semiconductor package according to the present embodiment includes the semiconductor package 101 described with reference to FIG. 7 and a semiconductor package 1101 having a mirror image of the semiconductor package 101 with respect to a package substrate 140. For example, according to an embodiment, the semiconductor package 101 is disposed on a top surface of the package substrate 140 and the semiconductor package 1101 is disposed on a bottom surface thereof.

The semiconductor package 101 has the same construction as that described with reference to FIG. 7. In the semiconductor package 1101, an interconnect structure 440, acting as an interposer, is disposed between a semiconductor device 1110 and the package substrate 140. The interconnect structure 440 includes anodized insulation regions 414 and interconnects 412 defined by the anodized insulation regions 414. The interconnect structure 40 acting as an interposer is connected to the semiconductor device 110 via the bumps 112, but is not limited thereto.

Figure 15:
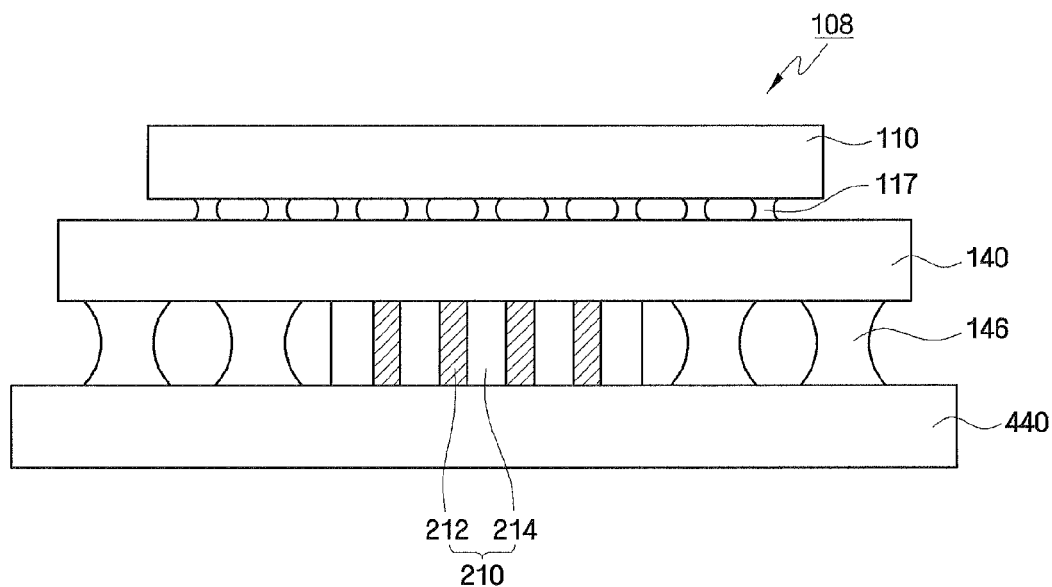
FIG. 15 illustrates a semiconductor system according to embodiments of the present inventive concept.

FIG. 15 illustrates a semiconductor system 108 according to embodiments of the present inventive concept. Referring to FIG. 15, the semiconductor system 108 includes a module substrate 540 and a semiconductor device 105 mounted in a package on the module substrate 540. The semiconductor device 105 has the same configuration as described with reference to FIG. 11.

External terminals 146 and an interconnect structure 210 are attached to the module substrate 540. According to an embodiment, the interconnect structure 210 is bonded to a package substrate 140 by a solder paste as described above so that the semiconductor device 105 communicates with the module substrate 540.

Figure 16:
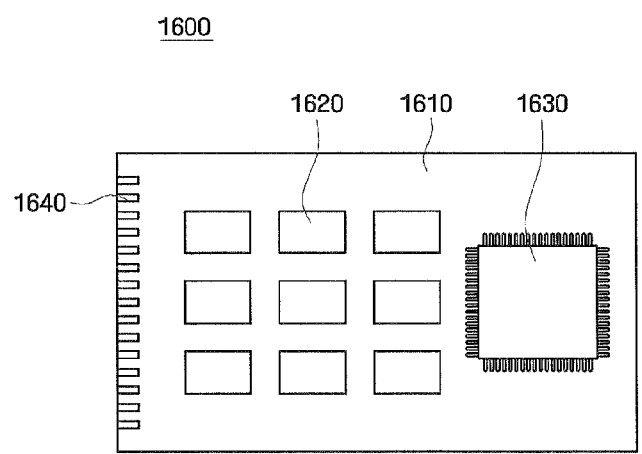
FIGS. 16 through 18 illustrate semiconductor systems 1600, 1700, and 1800 according to embodiments of the present inventive concept.
Figure 17:
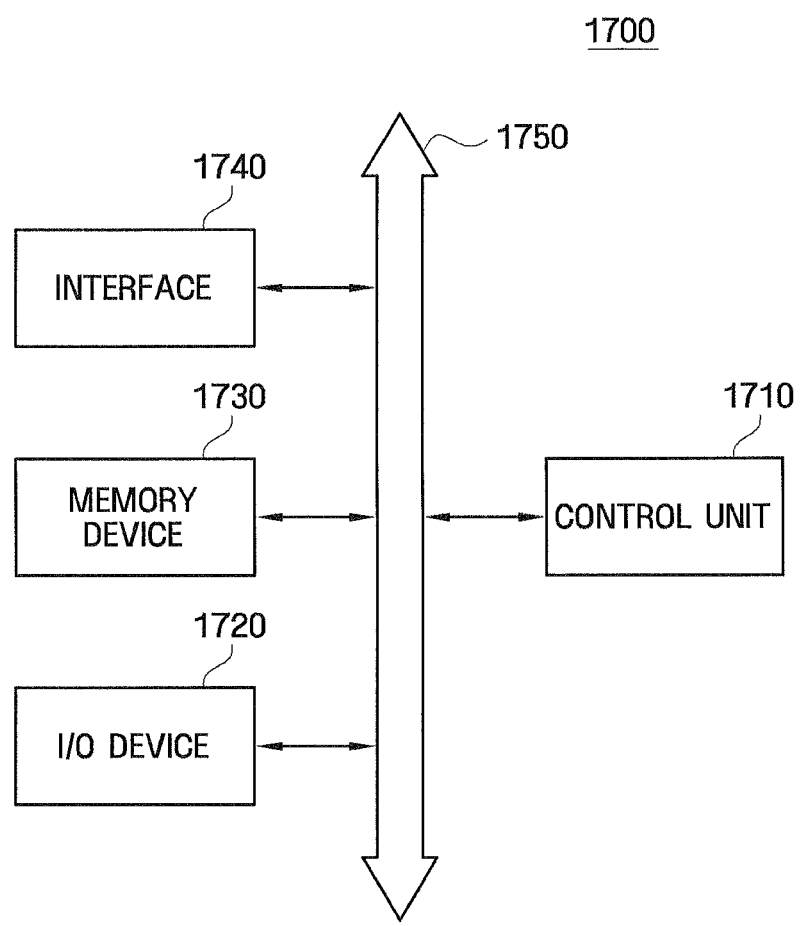
Figure 18:
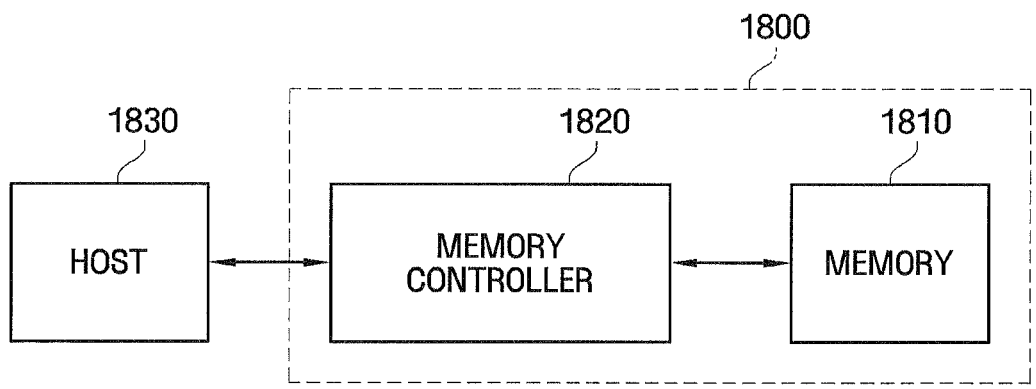

FIGS. 16 through 18 illustrate semiconductor systems 1600, 1700, and 1800 according to embodiments of the present inventive concept.

Referring to FIG. 16, the above-described semiconductor packages 101 through 108 may be applied to the semiconductor system 1600 accommodating various types of semiconductor elements in a package module. The semiconductor system 1600 includes a circuit board 1610 having terminals 1640 formed thereon, semiconductor chips 1620 mounted on the circuit board 1610, and a semiconductor chip 1630 packaged in a Quad Flat Package (QFP). The semiconductor chips 1620 and 1630 may be packaged using the packaging techniques according to the embodiments of the present inventive concept. The semiconductor system 1600 may be connected to an external electronic device via the terminals 1640.

Referring to FIG. 17, the above-described semiconductor packages 101 through 108 may be applied to the semiconductor system 1700 such as an electronic system. The semiconductor system 1700 includes a control unit 1710, an input/output (I/O) device 1720, and a memory device 1730 which are combined via a bus 1750 providing a pathway for transmitting/receiving data.

For example, the control unit 1710 includes at least one selected from the group consisting of at least one microprocessor, a digital signal processor, a microcontroller, and logic devices performing similar functions. The control unit 1710 and the memory device 1730 may each include at least one of the above-mentioned semiconductor packages. The I/O device 1720 may include at least one of a keypad, a keyboard, and a display device. The memory device 1730 may store data and/or commands that are executed by the control unit 1710.

The memory device 1730 may include a volatile memory such as dynamic random access memory (DRAM) and a nonvolatile memory such as a flash memory. For example, an information processing system such as a mobile device or desk top computer may be equipped with a flash memory. The flash memory may be used to construct a semiconductor disk device (SSD). In an embodiment, the electronic system 1700 stably stores a large amount of data in the flash memory.

The semiconductor system 1700 further includes an interface 1740 through which data are transmitted/received to/from a communication network. The interface 1740 may be a wired or wireless interface. For example, the interface 1740 may include an antenna or wired/wireless transceiver. The semiconductor system 1700 may further include an application chipset, a camera image processor (CIS), and another I/O device.

The semiconductor system 1700 may be realized in a mobile system, a personal computer (PC), an industrial computer, or a logic system having various functions. For example, the mobile system may be one of a Personal Digital Assistant (PDA), a handheld computer, a web tablet, a mobile phone, a wireless phone, a laptop computer, a memory card, a digital music system, and an information transmission/reception system. In a case where the semiconductor system 1700 performs wireless communication, it may be used in a communication system such as Code Division Multiple Access (CDMA), Global System for Mobile communication (GSM), North American Digital Cellular (NADC), Enhanced-Time Division Multiple Access (E-TDMA), Wide-band Code Division Multiple Access (WCDMA), or CDMA2000.

Referring to FIG. 18, the above-described semiconductor packages 101 through 108 may be implemented as a semiconductor system 1800 such as a memory card. According to the present embodiment, the semiconductor system 1800 includes a memory 1810 such as a nonvolatile memory and a memory controller 1820. The memory 1810 and the memory controller 1820 are used to store data or read the stored data. The memory 1810 may include at least one of nonvolatile memory devices employing the semiconductor packaging techniques according to the embodiments of the present inventive concept. The memory controller 1820 controls the memory 1810 to store data and read the stored data in response to a read/write request from a host 1830.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims to indicate the scope of the inventive concept.

What is claimed is:

1. A semiconductor package comprising:
   a first semiconductor device; and
   a first interconnect structure electrically connected to the first semiconductor device,
   wherein the first interconnect structure includes a first anodized insulation region and a first interconnect adjacent to the first anodized insulation region, wherein the first interconnect structure has a first surface and a second surface, wherein the first interconnect includes a first region exposed on the first surface of the first interconnect structure and a second region exposed on the second surface of the first interconnect structure, and wherein the first region has a different width than the second region.

2. The semiconductor package of claim 1, wherein the first interconnect is thicker than the first anodized insulation region.

3. The semiconductor package of claim 1, wherein the first semiconductor device is attached to the first interconnect structure by a solder paste.

4. The semiconductor package of claim 1, further comprising a package substrate,
wherein the first interconnect structure is disposed between the package substrate and the first semiconductor device.

5. The semiconductor package of claim 1, further comprising a second semiconductor device, wherein the first and second semiconductor devices are semiconductor chips and the first interconnect structure is interposed between the first and second semiconductor devices.

6. The semiconductor package of claim 1, further comprising a second semiconductor device disposed on a first surface of the first semiconductor device, wherein the first semiconductor device is a package substrate, and wherein the first interconnect structure is disposed on a second surface of the first semiconductor device.

7. The semiconductor package of claim 4, wherein the first semiconductor device is a semiconductor chip.

8. The semiconductor package of claim 4, wherein the first semiconductor device is a semiconductor package,
wherein the first interconnect structure is disposed between the package substrate and the first semiconductor device and creates a space between the package substrate and the first semiconductor device, and
wherein a second semiconductor device is disposed in the space.

9. The semiconductor package of claim 5, wherein the second semiconductor device is electrically connected to the first interconnect of the first interconnect structure and includes a through electrode penetrating the second semiconductor device.

10. The semiconductor package of claim 6, further comprising an external terminal formed on a portion of the second surface of the first semiconductor device.

11. A semiconductor package comprising:
a first semiconductor device; and
a first interconnect structure electrically connected to the first semiconductor device,
wherein the first interconnect structure includes a first anodized insulation region, a first interconnect adjacent to the first anodized insulation region, and a conductive peripheral region, and
wherein the first anodized insulation region electrically isolates the peripheral region from the first interconnect.

12. The semiconductor package of claim 11, wherein the peripheral region is grounded.

13. A semiconductor package comprising:
a first semiconductor device;
a first interconnect structure electrically connected to the first semiconductor device;
a package substrate; and
wherein the first interconnect structure includes a first anodized insulation region and a first interconnect adjacent to the first anodized insulation region, wherein the first interconnect structure is disposed between the package substrate and the first semiconductor device, wherein
the first semiconductor device is a semiconductor package; and
the first interconnect structure is disposed between the package substrate and the first semiconductor device, the semiconductor package further comprising:
a second interconnect structure disposed between the first semiconductor device and the first interconnect structure, wherein the second interconnect structure includes a second anodized insulation region and a second interconnect adjacent to the second anodized insulation region, and wherein the first and second interconnect structures create a space between the package substrate and the first semiconductor device; and
a second semiconductor device disposed within the space provided.

14. A semiconductor package comprising:
a first semiconductor device including a plurality of first external terminals having a first pitch;
a second semiconductor device including a plurality of second external terminals having a second pitch that is different from the first pitch; and
an interposer disposed between the first and second semiconductor devices and electrically connecting the first external terminals with the second external terminals,
wherein the interposer includes an anodized insulation region and an interconnect adjacent to the anodized insulation region, wherein the interposer has a first surface and a second surface,
wherein the interconnect includes a first region exposed on the first surface of the interposer and a second region exposed on the second surface of the interposer, and
wherein the first region has a different width than the second region.

15. A semiconductor system comprising:
a module substrate; and
the semiconductor package of claim 14 disposed on the module substrate.

16. A semiconductor package comprising:
a semiconductor device; and
an interconnect structure electrically connected to the semiconductor device,
wherein the interconnect structure includes a plurality of anodized insulation regions and a plurality of interconnects respectively positioned between adjacent anodized insulation regions, wherein the interconnect structure has a first surface and a second surface,
wherein the interconnects include first exposed on the first surface of the interconnect structure and second regions exposed on the second surface of the interconnect structure, and
wherein the first regions has a different width than the second regions.

17. The semiconductor package of claim 16, wherein ends of the interconnects protrude beyond at least one of top and bottom surfaces of the anodized insulation regions.

18. The semiconductor package of claim 16, wherein the interconnects are formed in substantially an L-shape.

19. A semiconductor package comprising:
a semiconductor device: and
an interconnect structure electrically connected to the semiconductor device,
wherein the interconnect structure includes a plurality of anodized insulation regions and a plurality of interconnects respectively positioned between adjacent anodized insulation regions, wherein the interconnects are formed in substantially an L-shape, and wherein top parts of the L-shaped interconnects are exposed at a first surface of the interconnect structure, and bottom parts of the L-shaped interconnects having a larger width than the top parts are exposed at a second surface of the interconnect structure, the second surface being positioned opposite the first surface.

20. A semiconductor package comprising:
a semiconductor device; and
an interconnect structure electrically connected to the semiconductor device,
wherein the interconnect structure includes a plurality of anodized insulation regions, a plurality of interconnects respectively positioned between adjacent anodized insulation regions, and a plurality of peripheral regions, wherein the anodized insulation regions electrically isolate the peripheral regions from the interconnects.

* * * * *